United States Patent [19]

Sawayama et al.

[11] Patent Number: 4,491,783

[45] Date of Patent: Jan. 1, 1985

[54] APPARATUS FOR MEASURING NOISE FACTOR AND AVAILABLE GAIN

[75] Inventors: Yoshihiko Sawayama, Yokohama; Katsuhiko Mishima, Tokyo, both of Japan

[73] Assignee: Tokyo Shibaura Denki Kabushiki Kaisha, Kawasaki, Japan

[21] Appl. No.: 370,916

[22] Filed: Apr. 22, 1982

[30] Foreign Application Priority Data

Apr. 25, 1981 [JP] Japan .................... 56-63001
Aug. 26, 1981 [JP] Japan .................... 56-133484

[51] Int. Cl.³ .................. G01S 7/40; G01R 27/28; G01R 29/26
[52] U.S. Cl. .................... 324/57 N; 455/226
[58] Field of Search .............. 330/2; 328/162, 163, 328/164; 455/50, 63, 226, 295, 296; 324/57 N, 57 R

[56] References Cited

U.S. PATENT DOCUMENTS

| | | | |
|---|---|---|---|
| 3,464,006 | 8/1969 | Kaylie | 324/57 N |
| 3,774,113 | 11/1973 | Chasek | 455/226 |
| 3,794,999 | 2/1974 | Gellekink | 455/226 X |
| 3,835,378 | 9/1974 | Edden | 324/57 R |

FOREIGN PATENT DOCUMENTS

| | | | |
|---|---|---|---|
| 47036 | 3/1982 | European Pat. Off. | 324/57 N |
| 64198 | 11/1982 | European Pat. Off. | 455/226 |

Primary Examiner—Stanley T. Krawczewicz
Assistant Examiner—Jose M. Solis
Attorney, Agent, or Firm—Finnegan, Henderson, Farabow, Garrett & Dunner

[57] ABSTRACT

Disclosed is a noise factor and available gain measuring apparatus in which a first noise source is connected to a first port of a circulator through a device under test, a second noise source is connected to a third port of the circulator, and the second port of the circulator is connected to a noise measuring circuit through a variable attenuator. In the apparatus, the noise factor and available gain of the device under test are separately evaluated on the basis of a plurality of overall noise factors measured with parameters of an excess noise ratio of the second noise generator and a noise factor of a noise measuring circuit containing the variable attenuator.

8 Claims, 3 Drawing Figures

APPARATUS FOR MEASURING NOISE FACTOR AND AVAILABLE GAIN

BACKGROUND OF THE INVENTION

The present invention relates to an apparatus for measuring noise factor and available gain in a linear two-port circuit.

Generally, the performance of a circuit processing weak signals, e.g., a receiver is described by noise factor, available gain, and sensitivity. Of these parameters, the sensitivity can easily be calculated from a frequency band width of the receiver, if the noise factor and available gain are known. In designing and manufacturing the receiver, the measurement and evaluation of the noise factor and available gain are of very importance. The measurements of these parameters have been separately made.

The available gain is given by a ratio P2/P1, where P1 is an available signal power of a signal source and P2 is an available signal power after it is passed through a device under test (referred to as DUT), when the signal source and DUT are connected in series.

The noise factor is defined as the ratio of (1) the total noise power available at the output port of the DUT when the input termination is at 290K to (2) that portion of (1) engendered by the input termination via the primary signal channel. The noise factor represented in dB is called as a noise figure. The noise factor is measured by connecting a noise source and DUT in cascade and by turning on and off the noise source. If it is assumed that the equivalent noise temperatures of the noise source are T2 and T1 and the noise power outputs are N2 and N1 respectively when the noise source is turned on and off, the noise factor F is expressed $$F = \frac{t_{ex2} - t_{ex1}}{Y - 1} - t_{ex1} \quad (1)$$

where $t_{ex2}$ and $t_{ex1}$ are each an excess noise ratio of the noise source, and are given by $T2/To - 1$ and $T1/To - 1$ when a standard temperature $To = 290K$, and Y called a Y factor is given by $N2/N1$.

However, a load included in a meter for measuring a noise power produces a thermal noise. Therefore, the meter can not directly measure the noise power of the DUT itself. Of course, if the equivalent noise temperature of the meter is at absolute zero the thermal noise is not produced. But, it is not practical to keep the temperature of the meter at absolute zero during the measurement. On the other hand, if the thermal noise from the meter is much smaller than the noise power output from the DUT, it can be neglected. Where the available gain of the DUT is large, the thermal noise from the meter will be negligibly small in comparison with the noise output of the DUT. However, recent receiving devices for higher frequencies are mostly provided with solid state components such as bipolar or field effect transistors, which generally have a relatively small available gain. It is necessary to connect an amplifying stage after the DUT if the DUT is such a solid state element having a small available gain. The noise factor of only the DUT has been separately evaluated on the basis of Friis formula from the overall noise factor. Assuming that the noise factor and available gain of the first stage (DUT), and the noise factor of the second or subsequent stage are respectively F1, Ga and F2, the overall noise factor Fm is expressed $$Fm = F1 + (F2 - 1)/Ga \quad (2)$$

From the above equation, F1 can be evaluated separately from the measured Fm, if F2 and Ga are known.

Generally, the noise factor and available gain of the DUT connected with the noise source are dependent on the source admittance Ys. The circuit characteristics at the second or subsequent stages are also dependent on the output admittance Yout of the DUT. Accordingly, the Friis formula should be written as $$Fm = F1(Ys) + \frac{F2(Yout) - 1}{Ga(Ys)} \quad (3)$$

Since Yout is dependent on the DUT, F2(Yout) must be calibrated for each DUT. The calibration of F2(Yout) is difficult, then the accuracy of the calibration is low. Additionally, the available gain Ga is measured by a separate measuring system. This possibly causes an error when connection of DUT is changed from the gain measuring system to the noise measuring system. For this background reason, the conventional noise factor measuring system fails to have accurate measurement and evaluation, where the DUT has a small available gain.

SUMMARY OF THE INVENTION

Accordingly, an object of the present invention is to provide a noise factor and available gain measuring apparatus which can accurately and simultaneously measure noise factor and available gain of a linear noisy two-port circuit by a simple operation.

To achieve the above object, a noise factor and available gain measuring apparatus according to the present invention comprises a noise source connected to an input port of a device under test, a circulator connected at a first port to an output port of the device under test, a noise measuring circuit with a variable attenuator connected to a second port of the circulator, and a circuit for injecting a noise or signal at a given level to a third port of the circulator.

According to the measuring apparatus, the noise factor and the available gain of the device under test is evaluated separately on the basis of a plurality of overall noise factors measured with parameters of an excess noise ratio of the circuit for injecting a noise or signal at a given level and a noise factor or noise output ratio of the noise measuring circuit.

DETAILED DESCRIPTION OF THE PREFERRED EMBODIMENTS

Figure 1:
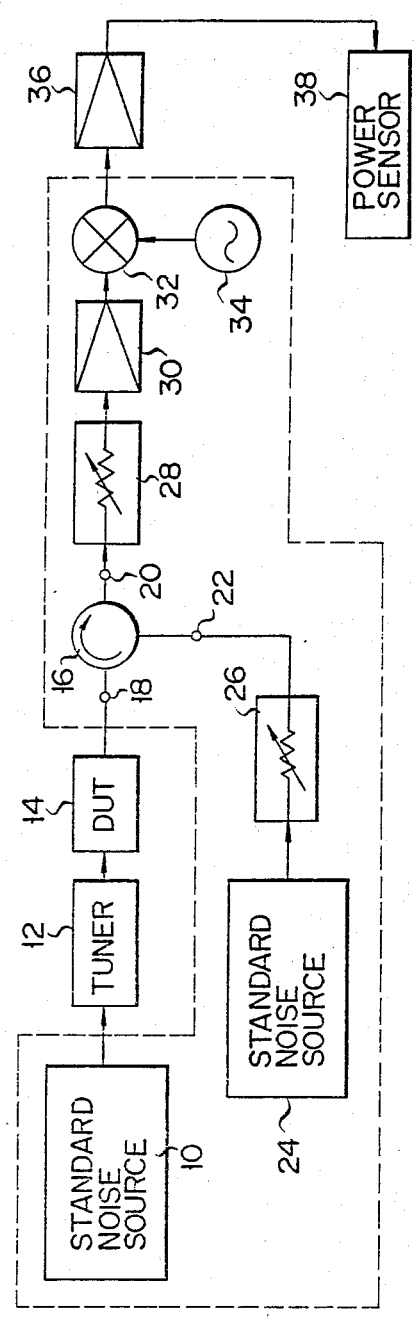
FIG. 1 shows a block diagram of an embodiment of a noise factor and available gain measuring apparatus according to the present invention.

An embodiment of a noise factor and available gain measuring apparatus according to the present invention will be described referring to the accompanying drawings. In FIG. 1, a standard noise source 10 such as a noise diode, a gas discharge tube, etc., is connected to an input port of a device under test (DUT) 14 through a reactive tuner 12. The reactive tuner 12 acts as an impedance transformer with no loss. An output port of the DUT 14 is connected to a first port 18 of a 3-port circulator 16. Another standard noise source 24 is connected to a third port 22 of the circulator 16 through a step attenuator 26. A second port 20 of the circulator 16 is connected to a first input port of a mixer 32, through a step attenuator 28 and an RF amplifier 30. A local oscillator 34 is connected to a second input port of the mixer 32 whose output port is connected to a power sensor 38 through an IF amplifier 36. A block enclosed by a broken line is a unit replaceable in accordance with a frequency band of the DUT 14.

Figure 2:
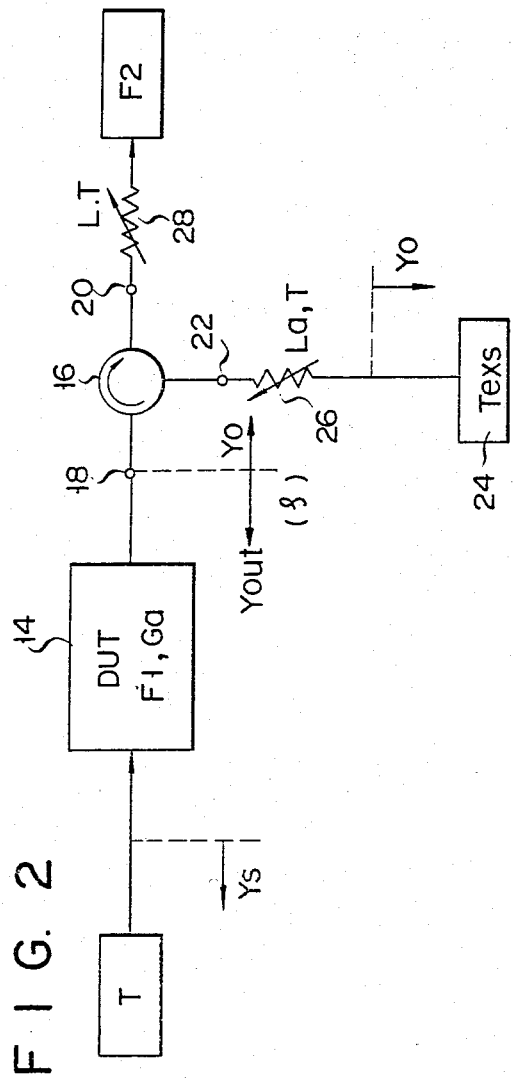
FIG. 2 is an equivalent circuit diagram illustrating the operation principle of the measuring apparatus shown in FIG. 1.

Before describing how the embodiment of FIG. 1 operates, it will be described the principle of measuring the noise factor and available gain, with reference to FIG. 2 illustrating an equivalent circuit. Assumption is made that noise factor and available gain of the DUT 14 are F1 and Ga, and a signal source admittance is Ys, an output admittance of the DUT 14 is Yout, and a characteristic admittance of a circulator 16 is Yo, and further that attenuation of the attenuators 28 and 26 connected to the second and third ports 20 and 22 of the circulator 16 are L and La, respectively. Incidentally, L and La of the attenuations indicate that the output levels of the attenuators are 1/L and 1/La of the input levels, respectively. It is further assumed that a noise factor of a noise measuring circuit made up of the RF amplifier 30, mixer 32, local oscillator 34, IF amplifier 36, and power sensor 38 is F2, and at the third port 22 of the circulator 16 is provided a matched termination.

When the standard noise source 10 and noise measuring circuit are set at a room temperature T and an excess noise ratio of the standard noise source 24 is Texs, an overall noise factor Fm taking T as the reference temperature is given $$Fm = F1(Ys) - \frac{1}{Ga(Ys)} + \frac{t_{es}\rho^2 + F2'}{Ga(Ys)(1 - \rho^2)} \quad (4)$$

where $$t_{es} = t_{exs}/La \quad (5)$$

$$F2' = LF2 \quad (6)$$

In the above equation, $\rho$ is an absolute value of reflection coefficient of the output admittance Yout of the DUT 14 seeing from the first port 18 of the circulator 16, and is expressed by $|(Yo-Yout)/(Yo+Yout)|$. $t_{exs}$ is an excess noise ratio of the Texs. $t_{es}$ and F2' in the numerator in the third term on the right side in the equation (4) respectively represent an excess noise ratio of the standard noise source 24 and a noise factor of the noise measuring circuit ($\rho=0$, $t_{es}=0$), both evaluated at the first port 18 of the circulator 16.

F2' is a noise factor of the noise measuring circuit obtained in consideration of an insertion loss of the attenuator 28. When L=1 (no loss), F2'=F2. When $\rho=0$, the equation (4) is equivalent to the equation (3). In the equation (4), by selecting the parameters $t_{es}$ and F2' at proper values, F1(Ys), Ga(Ys) and $\rho^2$ can be separated from Fm. F1(Ys), Ga(Ys) and $\rho^2$ are obtained by measuring Fm three times where the standard noise source 24 connected to the third port 22 of the circulator 16 is turned on and off to change the excess noise ratio to $t_{es}$ and 0 and an attenuation of the attenuator 28 connected to the second port 20 as an output port of the circulator 16 is changed to switch the noise factor of the noise measuring circuit to F2 (attenuation L=1, no attenuation) and F2' (attenuation L). The overall noise factor Fm when the noise source 24 is turned off ($t_{es}=0$) and the attenuation of the attenuator 28 is 1 (F2'=F2) is Fm1. The Fm when the noise source 24 is turned off ($t_{es}=0$) and the attenuation of the attenuator 28 is L (F2'=F2') is Fm2. The Fm when the noise source 24 is turned on ($t_{es}=t_{es}$) and the attenuation of the attenuator 28 is 1 (F2'=F2) is Fm3. These Fm1 to FM3 are $$Fm1 = F1(Ys) - \frac{1}{Ga(Ys)} + \frac{F2}{Ga(Ys)(1 - \rho^2)} \quad (7)$$

$$Fm2 = F1(Ys) - \frac{1}{Ga(Ys)} + \frac{F2'}{Ga(Ys)(1 - \rho^2)} \quad (8)$$

$$Fm3 = F1(Ys) - \frac{1}{Ga(Ys)} + \frac{t_{es}\rho^2 + F2}{Ga(Ys)(1 - \rho^2)} \quad (9)$$

Solving the simultaneous equations (7), (8) and (9), F1(Ys), Ga(Ys) and $\rho^2$ are given by $$\frac{1}{Ga(Ys)} = \frac{Fm2 - Fm1}{F2' - F2} - \frac{Fm3 - Fm1}{t_{es}} \quad (11)$$

$$\frac{\rho^2}{1 - \rho^2} = (Fm3 - Fm1)\frac{Ga(Ys)}{t_{es}} \quad (12)$$

As seen from the equations, the noise factor F1(Ys) and the available gain Ga(Ys) of the DUT with respect to a certain signal source admittance Ys can simultaneously be separated from the overall noise factor Fm. It is better that the parameter $t_{es}$ is set according to the expected available gain Ga of the DUT.

The F1(Ys) and Ga(Ys) obtained by using the above equations are for a certain signal source admittance Ys. Now, let us obtain F1(Ys) and Ga(Ys) as functions of Ys. The dependancy of F1 and Ga of the linear two-port circuit on Ys, as well known, is expressed, when Ys=Gs+jBs, $$F1(Ys) = Fo + \frac{Rn}{Gs}|Ys - Yon|^2 \quad (13)$$

$$\frac{1}{Ga(Ys)} = \frac{1}{GaO} + \frac{Rg}{Gs}|Ys - Yog|^2 \quad (14)$$

where Fo is a minimum noise factor, Yon (=Gon+jBon) an optimum signal source admittance for obtaining Fo, Rn an equivalent noise resistance, Gao a maximum available gain, Yog (=Gog+jBog) an optimum signal source admittance for obtaining Gao, and Rg an equivalent gain resistance.

As seen, F1(Ys) and Ga(Ys) are fully specified by noise parameters Fo, Yon, and Rn, and gain parameters Gao, Yog and Rg. To evaluate the noise factor and the available gain of the device, these parameters must therefore be obtained. These parameters may be obtained by measuring at least four sets of F1 and Ga by changing the signal source admittance Ys by the reactive tuner 12.

An actual measuring procedure (including the setting of $t_{es}$ and F2) will be described. To start with, the excess noise ratio $t_{el}$ for room temperature T of the standard noise source 10 is previously calculated by measuring the room temperature T. The standard noise source 24 is turned off and the attenuation of the attenuator 26 is set at a desired value La. The attenuation L of the attenuator 28 is set at 1. The steps up to this point are a preparation for the calibration of the measuring circuit.

To measure the noise factor F2' in the circuitry succeeding to the first port 18 of the circulator 16, the standard noise source 10 is directly coupled to the first port 18 of the circulator 16. F2' is obtained according to the equation (1) by using the indications N2 and N1 of the power sensor 38 when the standard noise source 10 is turned on and off and $t_{e1}$ ($t_{ex2}=t_{e1}$, $t_{ex1}=0$). Here, since L=1 in the attenuator 26, F2'=F2, the following equation is obtained.

$$F2 = t_{e1} / \left( \frac{N2}{N1} - 1 \right) \qquad (15)$$

In the above equation, F2 is the value in reference to the room temperature T and not to the standard temperature To.

To obtain the excess noise ratio $t_{es}$ to the room temperature T of the standard noise source 24, the first port 18 of the circulator 16 is short-circuited and the standard noise source 24 is turned on and off. The $t_{es}$ evaluated at the first port 18 of the circulator 16 can be obtained by using the equation (15) and the indications N2' and N1' of the power sensor 38 when the standard noise source 24 is turned on and off, as given below $$t_{es} = \left( \frac{N2'}{N1'} - 1 \right) F2 \qquad (16)$$

The calibration of the measuring circuit is finished through the above-mentioned procedure.

Then, the series circuit of the DUT 14 and the tuner 12 is connected between the standard noise source 10 and the circulator 16 and the tuner 12 is set so as to have a desired signal source admittance Ys. Then, the parameters $t_{es}$ and F2' are switched, as mentioned above and the overall noise factor Fm is measured three times to obtain the equations (7) to (9). With F2'=LF2, the noise factor F1 and available gain Ga of the DUT 14 are obtained by using the equations (10) and (11). In this case, F1 is referenced to the room temperature T. Therefore, to calibrate the noise factor F1 to that for the standard temperature To according to the definition of the noise factor, (T/To)(F1−1)+1 is newly set to the noise factor F1. At this point, the first measurement is completed. In the next step, the signal source admittance Ys is changed by the tuner 12 and F1 and Ga are measured four times, thereby to obtain the noise parameters Fo, Yon, and Rn, and the gain parameters Gao, Yog and Rg. In this way, the equations (13) and (14) are obtained.

As seen from the foregoing description, according to the embodiment, the noise factor and available gain of the device under test can simultaneously and accurately be obtained through only the measurement values of the overall noise factor Fm, without any complicated operation. The circulator used is probably not an ideal circulator in a practical situation. However, if it is adjusted to have a minimum insertion loss (i.e. to have a maximum isolation from the third port toward the second port), an error in the noise factor evaluation is almost negligible.

It should be understood that the present invention is not limited to the above-mentioned embodiment, but it may be modified and changed variously within the scope of the appended claims. For example, a 4-port circulator of which the fourth port has a reflectionless termination may be used for the circulator. A standard signal generator may be used in place of the standard noise source 24 and a minute signal at a given level is injected into a third port 22 of the circulator 16. If so done, the power reflection rate $\rho^2$ at the output port of the DUT 14 can directly be measured and therefore F1 and Ga can be evaluated by measuring the overall noise factor Fm two times.

Figure 3:
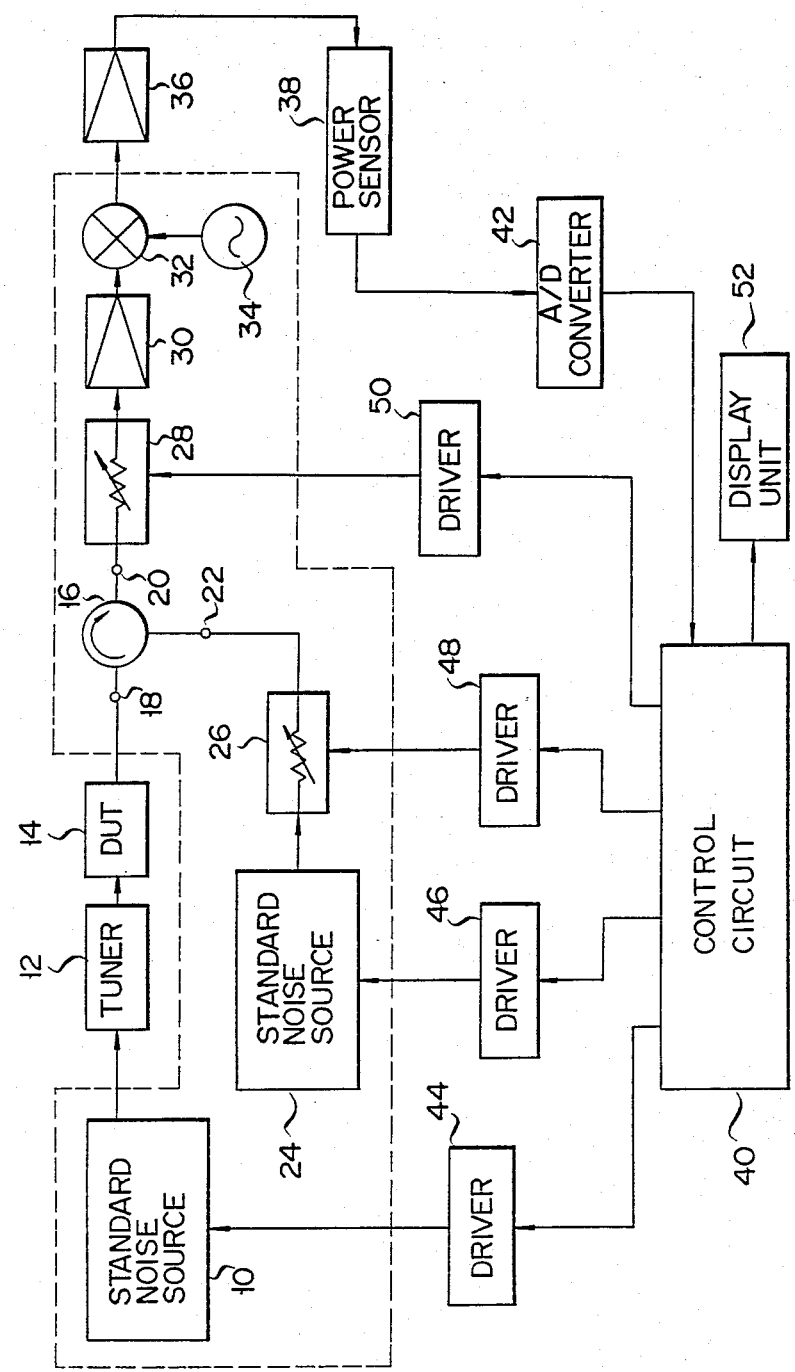
FIG. 3 is a block diagram of a modification of the embodiment shown in FIG. 1.

FIG. 3 shows a modification of the embodiment as mentioned above. In the modification, the portion relating to the measurement is the same as that of the first embodiment, but a control circuit 40 with an electronic computer containing a program of the above-mentioned procedure is additionally used. An output signal from the power sensor 38 is supplied to the control circuit 40 through an A/D converter 42. The output signal from the control circuit 40 is connected to the control terminals of the standard noise sources 10 and 24, and the attenuators 26 and 28, through drivers 44, 46, 48 and 50, respectively. A display section 52 is also connected to the control circuit 40. With this connection, the on-off control of the standard noise sources 10 and 24 and the adjustment of the attenuations of the attenuators 26 and 28 can automatically be done. The measurement process is further simplified.

Further, by using a synthesizer or a sweep signal generator for the local oscillator, a frequency-dependency of the noise factor and the available gain can also be evaluated readily.

The above-mentioned embodiments have been described with the RF amplifier for the DUT. The DUT may be a transducer including a mixer, local oscillator and IF amplifier.

What we claim is:

1. An apparatus for measuring the noise factor and available gain of a device under test forming a linear two-port circuit, comprising:
   first noise source means coupled to an input port of the device under test for generating a noise signal;
   a circulator having first, second, and third ports, the first port being connected to an output port of the device under test;
   second noise source means coupled to the third port of the circulator for generating a noise signal; and
   noise measuring means coupled to the second port of the circulator for measuring the overall noise factor of the system comprising the first noise source means, the device under test, the second noise source means, and the noise measuring means, thereby the overall noise factor is measured by said noise measuring means three times with the excess noise ratio of the second noise source means and the noise factor of the noise measuring means set at different values for each measuring so that the noise factor and available gain of the device under test can be calcutated from the three overall noise factors measured.

2. An apparatus according to claim 1, wherein said noise measuring means further includes means for determining the overall noise factor Fm according to:

$$Fm = F1(Ys) - \frac{1}{Ga(Ys)} + \frac{t_{es}\rho^2 + F2'}{Ga(Ys)(1 - \rho^2)}$$

where

F1(Ys) and Ga(Ys) are the noise factors and available gain of the device under test when the admittance of the first noise source means is Ys;

$\rho$ is an absolute value of reflection coefficient of the output admittance of the device under test; and $t_{es}$ and F2' are the excess noise ratio of the second noise source means and the noise factor of the noise measuring means.

3. An apparatus according to claim 1, wherein:

said second noise source means includes means for changing the excess noise ratio, and said noise measuring means includes a first variable attenuator for changing the noise factor.

4. An apparatus according to claim 1, further comprising:

a reactive tuner for coupling said first noise source means to said device under test;

a second variable attenuator for coupling said second noise source means to the third port of said circulator; and a frequency converter connected to the second port of said circulator and coupled to said noise measuring means.

5. An apparatus for measuring the noise factor and available gain of a device under test forming a linear two-port circuit, comprising:

noise source means coupled to an input port of the device under test for generating a noise signal;

a circulator having first, second, and third ports, the first port being connected to an output port of the device under test;

signal source means for injecting a variable signal into the third port of the circulator; and noise measuring means, coupled to the second port of the circulator, for measuring an overall noise factor of the system comprising the noise source means, the device under test, the signal source means, and the noise measuring means, whereby the overall noise factor is measured by said noise measuring means two times with the noise factor of the noise measuring means set for different values for each measuring so that the noise factor and available gain of the device under test can be calculated from the two overall noise factors measured.

6. An apparatus according to claim 5, wherein said noise measuring means further includes means for determining the overall noise factor Fm according to:

$$Fm = F1(Ys) - \frac{1}{Ga(Ys)} + \frac{t_{es}\rho^2 + F2'}{Ga(Ys)(1 - \rho^2)}$$

where

F1(Ys) and Ga(Ys) are the noise factors and available gain of the device under test when the admittance of the noise source means is Ys; and $\rho$ is an absolute value of reflection coefficient of the output admittance of the device under test; and $t_{es}$ and F2' are the excess noise ratio of the signal source means and the noise factor of the noise measuring means.

7. An apparatus according to claim 5, wherein:

said signal source means includes means for changing the excess noise ratio; and said noise measuring means includes a first variable attenuator for changing the noise factor.

8. An apparatus according to claim 5, further comprising:

a reactive tuner coupled to said noise source means and connected to said device under test;

a second variable attenuator coupled to said signal source means and connected to the third port of said circulator;

a frequency converter coupled to said noise measuring means and connected to the second port of said circulator.

* * * * *